United States Patent [19]

Dubernet et al.

[11] 4,103,230
[45] Jul. 25, 1978

[54] APPARATUS FOR ANALYZING ELECTRICAL SIGNALS OF VARIABLE AMPLITUDE

[75] Inventors: Robert Dubernet, Chatillon; Lucien Janvier, Monthlhery; Roger Tirilly, Verrieres-Le-Buisson; Patrick O'Connolly, Clamart, all of France

[73] Assignee: Societe Nationale Industrielle Aerospatiale, Paris, France

[21] Appl. No.: 703,375

[22] Filed: Jul. 8, 1976

[30] Foreign Application Priority Data

Jul. 8, 1975 [FR] France .............................. 75.21355

[51] Int. Cl.² ........................................ G01R 23/16
[52] U.S. Cl. .............................. 324/77 H; 324/77 E
[58] Field of Search ................... 324/77 G, 77 H, 95, 324/77 E, 103 P

[56] References Cited

U.S. PATENT DOCUMENTS

| 3,167,738 | 1/1965 | Westerfield | 324/77 E |
| 3,611,411 | 10/1971 | Moshier | 324/77 E |
| 3,617,882 | 11/1971 | Ishikawa | 324/77 E |

*Primary Examiner*—Rudolph V. Rolinec
*Assistant Examiner*—Michael J. Tokar
*Attorney, Agent, or Firm*—William D. Stokes

[57] ABSTRACT

An electrical signal analyzing circuit for manually controlling the durational sequencing of an integrator circuit for providing visual readout of test signal divergence and maximum peak voltage levels. The integrator circuit is first time delay activatable for a predetermined duration according to a counter circuitry having a preselectable end of time count. The admittance of a variable amplitude test signal to the analyzing circuit is controllable according to a second time delay for a duration determined by the end of time count.

11 Claims, 3 Drawing Figures

APPARATUS FOR ANALYZING ELECTRICAL SIGNALS OF VARIABLE AMPLITUDE

The present invention relates to an apparatus for analysing electrical signals of variable amplitude. It is more particularly, though not exclusively, applied in electrical simulating devices, particularly for analysing the divergence signals.

Apparatus are already known which enable staff to be qualified for and adapted to the use of more or less complicated equipment. Generally, these known apparatus are very elaborate and numerous parameters are taken into account, resulting in their being cumbersome and not very manageable. Consequently, when it is desired to make certain partial checks, for example follow divergence signals and retain only the average value and the peak value, this operation often proves difficult with these apparatus since they are not well adapted to this type of verification (long adjustment and execution).

The present invention avoids these drawbacks; it enables rapid checks to be made at any moment due to its simplicity of construction and functioning. In addition the manageability and lightness of the analyser apparatus enable it to be transported, this being particularly advantageous when it is desired to make a simulation from a moving object.

It is therefore an object of the present invention to provide a signal analyser apparatus enabling, for example, signals given by a divergence producing apparatus, for example of the infra-red goniometer type or laser radiation type, to be followed and analysed simply.

To this end, the invention relates to an apparatus for analysing at least one electrical signal of variable amplitude having at least one measuring chain comprising on the one hand an assembly for processing said signal provided with a rectifier followed by a controllable integrator, means for displaying the processed signal and a controlled switch checking the admission of this signal in said rectifier and, on the other hand, a logic assembly for controlling the functioning of said processing assembly, which logic assembly is itself controlled by a switch arrangement and which controls said switch and said integrator with a delay with respect to the other which it receives from said switch arrangement.

The delay with which said controlled switch is controlled is preferably greater than the delay with which said integrator is controlled. However, the logic control assembly also enables said switch to be controlled with a delay shorter than the delay controlling said integrator.

The display means may comprise on the one hand display elements displaying the peak value of the signal to be analysed and on the other hand display elements displaying the average value of said latter. The processing assembly advantageously comprises a threshold circuit and display means associated therewith indicating that the instantaneous amplitude of the signal has exceeded a predetermined threshold.

In order to be able to function according to given time sequences, the apparatus is noteworthy in that the logic control assembly comprises a clock and a counter allowing the integrator of the processing assembly to function for a determined length of time. Of course, to enable the duration of said sequences to be varied, the apparatus may be such that, between the rectifier and the integrator, the processing assembly comprises a means for selecting the duration of integration, connected to said clock and to said counter of the logic control assembly.

The switch arrangement preferably comprises means for mechanically and electrically controlling the triggering of said logic control assembly. The switch arrangement may comprise, in addition mechanical control means for testing the logic control assembly and the processing assembly. In a preferred embodiment, the logic control assembly comprises, on the one hand, a first storage circuit whose input is connected to the switch arrangement and of which one output controls said integrator and, on the other hand, a second storage circuit whose input is connected to an output of the first and of which one output controls said controlled switch. It is then advantageous if the outputs of the two storage circuits are each connected to an input of a logic NAND gate, of which the other inputs are rendered active by a monostable multivibrator actuated by said counter, the output of the logic gate associated with the first storage circuit actuating said integrator via a first flip flop and a switch, whilst the output of the logic gate associated with the second storage circuit actuates, via a second flip flop, the controlled switch of the processing assembly. The first flip flop may, furthermore activates a third logic NAND gate which, in combination with said clock, controls the incrementation of said counter.

The apparatus advantageously comprises at least two identical measuring chains incorporated in a single box, on which the different display means and mechanical control means are mounted. Such a box may be portable and said display and control means may be comprised on one of its faces.

The invention will be more readily understood on reading the following description with reference to the accompanying drawings, in which.

In these figures, like elements are given like reference numerals.

Figure 2:
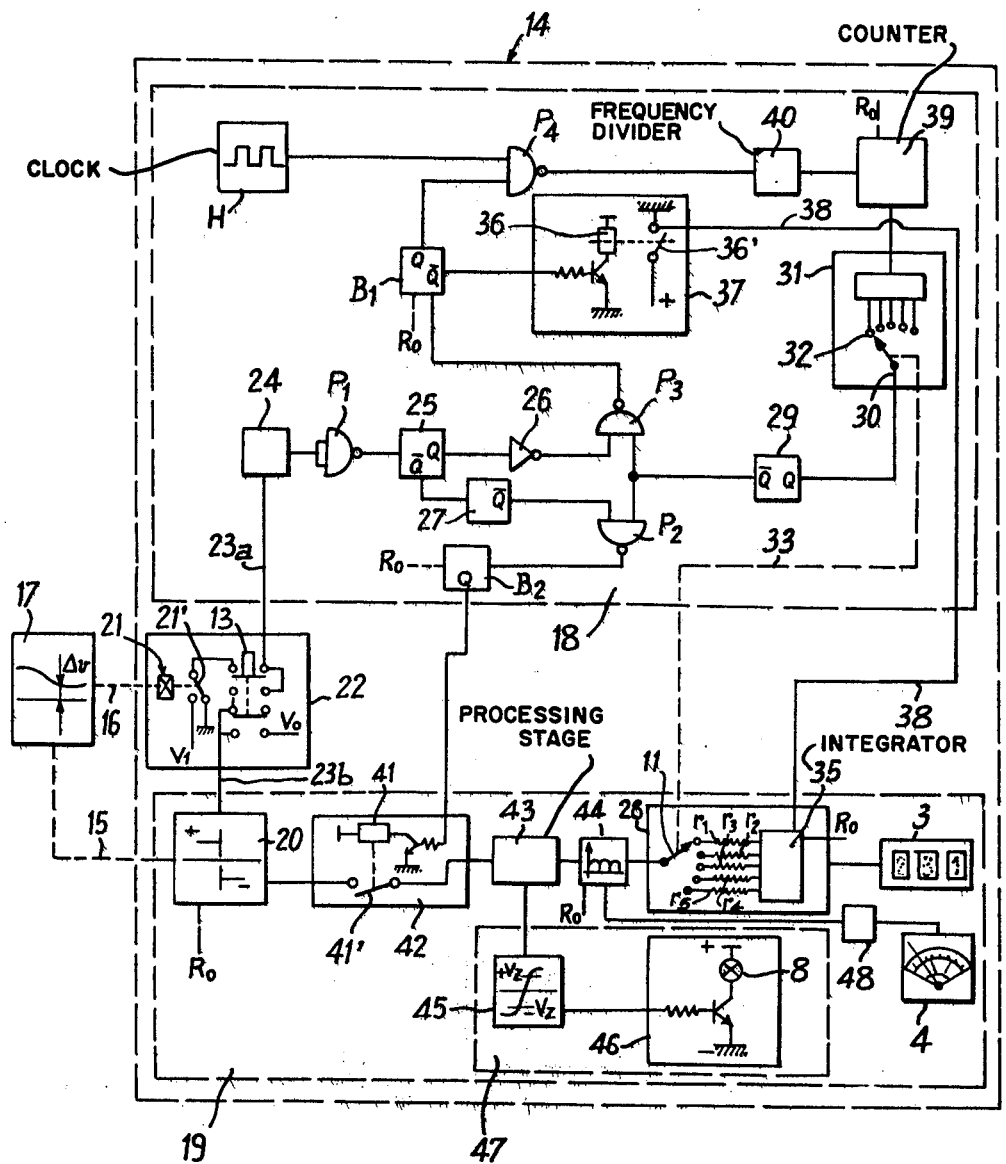
FIG. 2 is a block diagram of a measuring chain contained in the apparatus of FIG. 1.

Referring now to the drawings, the Figures show, by way of example the apparatus according to the invention which is more particularly intended to be associated with a simulation device, comprising a divergence producing device (cf. FIG. 2). It comprises two identical measuring chains in order to be able to follow two types of signals simultaneously. In this way, for example, if these two types of signals constitute a simulated representation in the vertical plane and in the horizontal plane it may analyse all the divergences of an object, which may or may not be mobile, with respect to a system of references.

Figure 1:
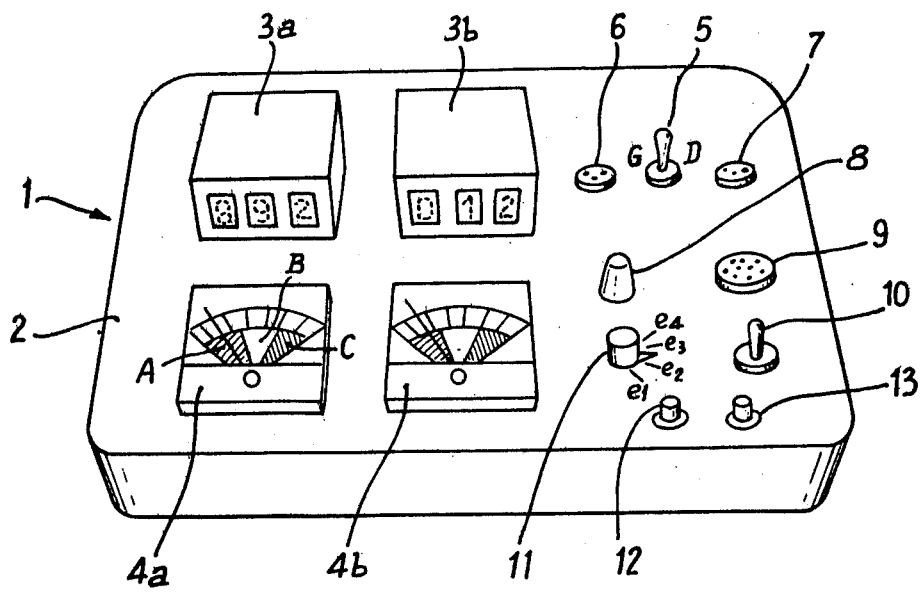
FIG. 1 shows a perspective view of an embodiment of the apparatus in accordance with the invention, showing its upper face.

To this end, the apparatus of FIG. 1, of which the two measuring chains are incorporated in a box 1, for example a portable one of substantially parallelepipedic form, has an upper face 2 on which are arranged two identical display devices 3a and 3b, for example of the electro-optical translator type and two indicators 4a and 4b with indexes, respectively. The display device 3a is associated with the indicator 4a to translate the results of the first measuring chain. Similarly, the display device 3b and the indicator 4b are associated with the second measuring chain.

The dials of the index indicators 4a and 4b comprise a graduated scale, giving the peak value of the analysed signals and are divided into three areas A, B, C, coloured differently, enabling the result of the analysis to be readily seen. These differently coloured areas, previously standardised, may, according to the degree of precision desired, divide the extent of the measuring scale of said indicators equally or unequally. In this way, when the index of one of the indicators has stopped inside an area, the operator can see whether the result of the simulation test to which he is subjected is good average or poor. The graduations enable the exact value of the result to be specified in detail.

The warning lights 3a and 3b preferably project from said upper face 2 to permit easier reading thereof, and for each chain, they indicate the average values of the divergence signal recorded.

To the side of these display elements, control and checking members are placed on said upper face 2. Among these control members, these is a three-position switch 5 for selecting the mode of supply. Apart from its median position which represents stop, said switch 5, when placed to the left (reference G), permits D. C supply via a point 6 which is, for example, of the three-pin Jaeger type, and, when placed to the right (reference D), a supply from the mains via a point 7 which is different from said point 6.

To alert the operator that a critical value has just been reached, on either one of the measuring chains, at least one warning light 8 is mounted on the upper face 2 of the box 1. As will be seen hereinafter, this warning light is controlled by a threshold circuit which may possibly stop the recording of the corresponding divergence signal.

The arrival of the signals to be analysed at the input of the two chains is ensured by a multi-pin point 9, whilst another control switch 10 is provided to trigger off the start of a sequence of signal analysis, the functioning time of which sequence may be previously selected by an adjustable switch 11.

To enable the different control elements of the apparatus to be returned to zero and to introduce at the same time the logic levels necessary for starting a sequence, a first push button 12 is provided, whilst a second push button 13 enables the internal circuits to be checked. As is decribed hereinafter, these internal circuits are checked when the push-button 13 is pushed in, this manoeuvre substituting for the input signals to be analysed a known reference signal which is immediately displayed by the display devices and indicators 3a, 3b, 4a and 4b.

It is obvious that the external form of the box 1 is not necessarily parallelepipedic and that, according to the desired application, any other shape may be made, the display, control and checking elements being disposed as functionally appropriate.

FIG. 2 shows the diagram of one of the measuring chains incorporated in the box 1 and with which are associated the display elements 3 and 4 (corresponding to 3a or 3b and 4a or 4b respectively). In order to simplify the description of such a chain, given by way of example, the elements composing in particular the supply unit and the return to zero circuit have not been shown. Only the return to zero (designated by $R_0$) has sometimes been indicated to show how the chain according to the invention functions.

The measuring chain 14, shown in FIG. 2 is on the one hand connected, via data transmission lines 15 and 16 (which pass through point 9) to a device 17 of known type for producing a divergence signal and on the other hand comprises a logic control assembly 18 connected to an assembly 19 for processing the divergence signal supplied by the device 17.

As soon as a signal appears at the output of the device 17, which signal is constituted by voltage variations $\Delta v$, it is conveyed via line 15 towards the input circuit 20 of the processing assembly 19. In this input circuit 20, which acts as matching circuit, this signal is brought by known means to a certain positive or negative voltage level, i.e. to a potential difference which is compatible with the characteristics of the processing device 19, for example $\pm 10V$.

At the same time as presenting the signal $\Delta v$ to the input circuit 20, the device 17 produces a control order which is transmitted via line 16 to an electromagnetic relay 21 forming part of a switch and test arrangement. This relay 21 receiving said order, automatically closes its contact 21' which passes from one position for which it is connected to earth, to a position for which it is connected to a potential $V_1$. The fixed stud of contact 21' is connected to a line 23a whose potential therefore passes from zero to $V_1$ in the case of closure of contact 21'. The line 23a controls the functioning of the logic assembly 18 and its connection to potential $V_1$ enables a sequence of analysis to be triggered off. Besides this start controlled from the divergence-creating device 17, it may be advantageous to trigger off a sequence of analyses directly.

To this end, the switch 10, placed on the upper face 2 (cf. FIG. 1) is mechanically connected to the contact 21 in a manner not shown in FIG. 2 and enables such a start to be manually controlled by acting locally and directly on said contact 21'.

Furthermore, the above-mentioned push-button 13 is incorporated in the switch and test arrangement 22 to control the simultaneous sending of a reference and test signal $V_0$ in the input circuit 20 of the processing chain 19 by a line 23b and on line 23a.

In certain cases and particularly for facilitating the supply conditions, the potential $V_0$ may advantageously be equal to $V_1$.

As indicated in FIG. 2, the line 23a is connected, on the side opposite the arrangement 22, to the input device 24 of the logic control assembly 18. Said latter comprises, downstream of the input device 24, a first logic gate $P_1$ of NAND type which is mounted as an inverter and which receives from the device 24 the information necessary for starting the sequence of analysis. The gate $P_1$ transmits to a store 25 a logic control order, reverse of the input signal, to enable said latter to be put in operation. The store 25 is for example of the logic TTL type and it may be composed of flip flops connected in series so as to store the information received for a determined period of time. The store 25 delivers after a waiting period $\Delta T$, a first logic output pulse transmitted to a inverter 26 and a second logic output pulse forming the input signal of a second store 27.

A store 27, for example similar to store 25, delivers, after a wait $\epsilon$, shorter than the first wait $\Delta T$, an output pulse transmitted to one of the inputs of a second logic gate $P_2$ of NAND type.

Consequently, with a delay $\Delta T$ and through the inverter 26, the control signal may be transmitted to one of the inputs of a third logic gate P₃ of NAND type, whilst this control signal is transmitted to gate P2 with a delay equal to $\Delta T + \epsilon$.

To fulfill the other input conditions of gates P₂ and P₃ which control the admission of the divergence signal into the processing assembly 19 and the starting of an integrator assembly 28 of the processing assembly 19 respectively, a monostable multivibrator 29 maintains at its output a pulse forming the control signal for the other inputs of said gates P₂ and P₃.

According to a varient embodiment, the store 27 could be adjusted to transmit its information without delay $\epsilon$; under these conditions, the gates P₂ and P₃ would be activated practically at the same time, the integration then being started at the same moment as the admission of the divergence signal (after the control delay $\Delta T$, contrary to what happens when $\epsilon$ exists) the setting into action of the integrator then being effected before the admission of the divergence signal (as will be seen hereinafter). The monostable multivibrator 29 is connected to the output 30 of a decoder 31, for example of the BCD type, said output being validated by an adjustable switch 32 connected, via a connection 33, to the switch 11 included in the integrator assembly 28 (cf. FIG. 1). According to its position, this switch 11 makes it possible to determine, by the choice of one of the resistances r1, r2, r3, r4, r5, the functionning time of the integrator 35 of the assembly 28, i.e., as will be seen, the duration of a sequence of analysis. The output of gate P₃ is connected to a first flip flop B₁, e.g. of the type J.K. delivering two pieces of the logic information. When the output of the gate P₃ is activated, the flip flop B₁ eliminates on the one hand the supply of the electromagnetic relay 36 of the switch device 37 and on the other hand sends a logic signal to one of the inputs of a fourth logic gate P₄ of NAND type.

When the relay 36 is supplied, it closes its contact 36', this causing a line 38 to be at logic level 1. The effect of this is to transmit to the integrator 35 the logic condition ordering the actuation of the integration. The logic level transmitted to gate P₄ via the flip flop B₁ is then combined in this gate with the signals sent by a clock H to its other input, so that on each edge, for example negative, of a clock signal, the gate P₄ communicates to a counter 39 a counting pulse. The counter 39 is connected to the decoder 31, whilst a frequency divider 40 may be disposed between the gate P₄ and said counter to allow the control signal, triggered by the gate P₄, to be adapted to the input possibilities of the counter.

The output of the gate P₂ is connected to a second flip flop B₂ delivering, when the gate P₂ is active, a logic signal controlling the closure of the contact 41' of a relay 41 (switch arrangement 42), said closure allowing the passage of the divergence signal, present in the input device 20, towards the downstream part of the processing assembly 19. After admission, the divergence signal is transmitted to a processing stage 43, enabling a relatively high impedance to be obtained with respect to the divergence producing device 17 and carrying out a filtering of the frequences above a certain value, e.g., of 15 Hz.

The stage 43 comprises two outputs, one which transmits to a rectifier 44 and the other which directs said signal to a comparator 45, in which it is compared a reference voltage $\pm V_z$.

When the positive or negative reference voltage $V_z$ is reached by the divergence signal in the course of simulation, the different internal circuits of the comparator 45 deliver a signal causing the excitation of the alarm circuit 46, in which the warning light 8 is incorporated (cf. FIG. 1).

The comparator 45 and the alarm circuit 46 thus form a threshold circuit 47 which may be used for various positive or negative reference values $V_z$ or may be put out of operation. According to the regulation adopted, the threshold circuit 47 may also either simply indicate to the operator (via the warning light 8) that a critical value has just been produced and allow the sequence of analysis to continue, or after this signalling, may disconnect the input signal by known means (not shown).

Figure 3:
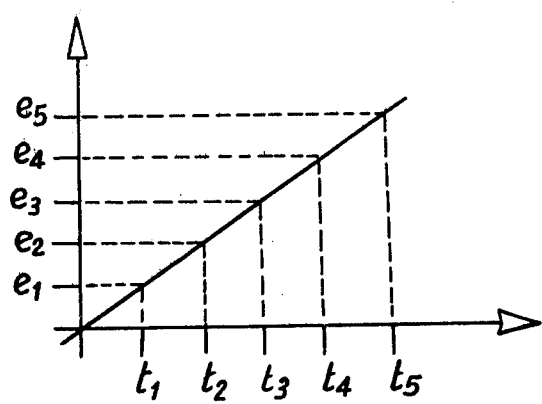
FIG. 3 is a diagram illustrating part of the functioning of the apparatus of FIGS. 1 and 2.

The signal, rectified in known manner by the rectifier 44, is transmitted on the one hand to the integrator assembly 28 where it is integrated by the integrator 35 and on the other hand to a peak-voltage-maintaining-device 48 connected to the index indicator 4. This latter is for example of the galvanometer type with store retaining only the maximun peak value recorded in the course of a sequence of analysis. As indicated previously, the position of the switch 11 determines the duration of the sequence. Thus, with each resistance r1, r2, etc. . . . , there may be associated a duration of functioning t1, t2, etc. . . . to which a certain space crossed e1, e2, etc. . . . may be made to correspond, for example in the case of a simulation for a moving object (cf. the diagram of FIG. 3).

On the upper face of the divergence analyser apparatus, such space have been represented around the switch button 11.

At the end of a selected analysis sequence, the integrator 35 gives the average value of the divergences obtained, said divergences being displayed by the electro-optical translator 3. In order to explain more precisely how the apparatus according to the invention function, the following Table gives the different logic states of the gates P₁, P₂, P₃ and P₄ for a sequence whose duration is included between instants $t_0$ ant $t_1$.

TABLE

|  |  | $t_o = 0$ | $t_o + \Delta T$ | $t_o + \Delta T + \epsilon$ | $t_1$ |
|---|---|---|---|---|---|
| P₁ | X = Y = | 0 | 1 | 1 | 1 |
|  | S = | 1 | 0 | 0 | 0 |
| P₂ | X = | 1 | 1 | 1 | 1 |
|  | Y = | 1 | 1 | 0 | 1 |
|  | S = | 0 | 0 | 1 | 0 |
| P₃ | X = | 0 | 1 | 1 | 0 |
|  | Y = | 1 | 1 | 1 | 1 |
|  | S = | 1 | 0 | 0 | 1 |
| P₄ | X = | 1 | 0 | 0 | 1 |
|  | Y = | 1 | 1 | 1 | 1 |
|  | S = | 0 | 1 | 1 | 0 |

Each logic gate P₁ to P₄ comprises two inputs X, Y and an output S connected, in Boole notation, by the conventional logic equation $S = \overline{X.Y}$.

This Table gives the logic levels of the inputs and of the output of said gates at four instants : $t_0$, $t_0 + \Delta T$, $t_0 + \Delta T + \epsilon$ and $t_1$.

At initial instant $t_0$, after selection via the switch 11 of the duration of functioning defined by the difference $t_1 - t_0$, the different logic circuits TTL are switched on and a return to zero R₀ is effected.

The contact 21' which is connected to earth gives the logic level 0 on line 23a, this enabling the reverser gate P₁ to present to the input of the store 25 the logic level 1. As indicated in FIG. 2, the outputs of the store 25 then deliver a first pulse corresponding to level Q = 1 towards the inverter 26 and a second inverse pulse $\overline{Q} = 0$ towards the second store 27.

Consequently, after the inverter 26 and the store 27, the gate $P_3$ has one of its inputs at logic level 0 and gate $P_2$ one of its inputs at level 1. The monostable multivibrator 29, reversing the polarity of its input signal given by a return to zero of the counter 39, gives the logic level 1 at its output, said level forming the second inputs of gates $P_2$ and $P_3$. In this way, the outputs of gates $P_2$ and $P_3$ communicate to flip flops $B_2$ and $B_1$ respectively logic information which make said flip flops, in view of their output direction Q and $\overline{Q}$ (cf. FIG. 2) inoperative. The contacts 36' and 41' consequently remain open and the gate $P_4$ is passive, no signal being admitted at the input of the processing assembly 19. On closure of contact 21', the line 23a is taken to potential $V_1$ and the gate $P_1$ addresses an instruction which is stored in the store 25 for a duration $\Delta T$. After this first delay $\Delta T$, the store 25 delivers its two pieces of output information, one being stored in turn in the store 27, whilst the other enables the gate $P_3$ to be rendered active.

At instant $t_0 + \Delta t$, the contact 36' is closed, thus allowing the integrator 35 to be set into action and the gate $P_4$ transmits to the counter 39 the counting pulses at the rhythm of the clock H. The gate $P_2$ remains at the same logic levels as at instant $t_0$, whilst the outputs of the gates $P_1$, $P_3$ and $P_4$ change their logic levels (cf. Table).

In this way, for a duration $\Delta T$, the signal of the divergence-producing device 17 is therefore present on the input device 20 of the processing assembly 19, but not admitted into this latter. This delay $\Delta T$ may correspond, for example, to the adaptation time necessary for the operator to follow his target, or to a delay simulating an operational phase.

The output information of the store 25 which is then stored in the store 27 for a duration $\epsilon$, after the first delay $\Delta T$, allows setting into operation and an electrical adaptation of the elements of the processing assembly, particularly in order to avoid the integrator suffering the consequences of the interference due to the switching of the various relays.

At instant $t_0 + \Delta T + \epsilon$, i.e. at the end of the second delay of control the gate $P_2$ becomes active and the flip flop $B_2$ triggers the closure of contact 41', causing the admission of the divergence signal in the processing treatment 19. The different gates occupy, at this instant, the logic levels given in the column of the Table at instant $t_0 + \Delta T + \epsilon$.

At the end of the sequence, i.e. at instant $t_1$, the output of the decoder 31 is modified as soon as the incrementation of the counter 39 has terminated, this bringing about a modification of the logic output level of the monostable multivibrator 29. This modification renders the gates $P_2$ and $P_3$ inoperative, whilst the integration is stopped, as well as the admission of the clock signals.

At instant $t_1$, the gates $P_2$, $P_3$ and $P_4$ refind in this way the initial logic levels that they occupied at time $t_0$, a return to zero $R_0$ also enabling the gate $P_1$ to find its initial logic states again.

The divergence analyser apparatus according to the invention therefore enables all the divergence signals to be effectively followed in the course of a simulation. Moreover, its simplicity and control logic enables a delay to be obtained in the admission of the divergence signal, said delay adapted to the sequence of simulation envisaged. The lightness and manageability of the analyser facilitate its use for a simulation in flight.

Of course, the functioning which has just been described assuming that device 17 is in operation, may be applied mutatis mutandis to the case device being out of operation and a test being effected by pressing on the push button 13. It is then voltage $V_0$ which serves as signal to be analysed for the processing assembly 19, the push button 13 sending the signal for triggering the control assembly 18.

What we claim is:

1. Apparatus for analyzing at least one electrical signal of variable amplitude, comprising:
   a processing assembly for receiving an electrical signal, said processing assembly (including) comprising:
   (a) a rectifier for rectifying the signal;
   (b) means for maintaining the peak voltage of the rectified signal;
   (c) a controllable integrator electrically connected to the output of said rectifier for integrating the rectified signal; and
   (d) a controllable switch for checking the admission of the signal into said rectifier;
   a first display element for displaying said peak voltage;
   a second display element for displaying the integrated signal output of said integrator;
   a control switch arrangement; and a logic assembly for controlling said processing assembly comprising:
   (a) first means actuable by said control switch arrangement for switching said controllable switch of said processing assembly after a first time delay for admitting the signal to said rectifier;
   (b) second means actuable by said control switch arrangement for actuating said controllable integrator to begin integrating, after a second time delay; and
   (c) counter means actuable by said control switch arrangement after said second time delay for transmitting the integration after a predetermined length of time.

2. Apparatus according to claim 1 wherein said first time delay is greater than said second time delay.

3. Apparatus according to claim 1 wherein said processing assembly further includes a threshold circuit for receiving the electrical signal, said threshold circuit for indicating the instantaneous amplitude of the electrical signal has exceeded a predetermined value; and a display means associated with said threshold circuit for visually indicating the exceeding of said predetermined value.

4. Apparatus according to claim 1 wherein said processing assembly further includes selectable means electrically interposing said rectifier and said integrator for selecting the functioning time of said integrator, said selectable means cooperating with said counter means for correspondingly selecting said predetermined length of time.

5. Apparatus according to claim 1 wherein said control switch arrangement is manually actuable.

6. Apparatus according to claim 1 wherein said control switch arrangement is actuable by the electrical signal.

7. Apparatus according to claim 5 wherein said control switch arrangement further includes means for conveying a known test signal to said processing assembly.

8. Apparatus according to claim 1 wherein said second means includes a first storage circuit having an input connected to said control switch arrangement for storing a signal for said second time delay, said first storage circuit having an output for actuating said integrator; and wherein said first means includes a second storage circuit having an input connected to said output of said first storage circuit for storing the output of said first storage for a time delay, said second storage circuit having an output for switching said controllable switch of said processing assembly.

9. Apparatus according to claim 8 and further including:
   a pair of logic NAND gates, one of said NAND gates receiving an input from said first storage output and other of said NAND gates receiving an input from said second storage output;
   a monostable multivibrator feeding an input to each of said NAND gates, said multivibrator actuated by said counter means a pair of flip flops, one of said flip flops actuated by the output of said one NAND gate and other of said flip flops actuated by said other NAND gate, said other of said flip flops having an output for switching said controllable switch of said processing assembly; and
a switch means connected to the output of said one of said flip flops, said switch for actuating said integrator.

10. Apparatus according to claim 9 wherein said one of said flip flops actuating said counter means to begin counting.

11. Apparatus according to claim 10 and further including a NAND gate connected to the output of said one of said flip flops, said NAND gate controlling the incrementation of said counter means.

* * * * *